United States Patent
Lu et al.

(10) Patent No.: US 12,010,838 B2
(45) Date of Patent: Jun. 11, 2024

(54) STAIRCASE STRUCTURE FOR MEMORY DEVICE

(71) Applicant: Yangtze Memory Technologies Co., Ltd., Hubei (CN)

(72) Inventors: Zhenyu Lu, Hubei (CN); Jun Chen, Hubei (CN); Xiaowang Dai, Hubei (CN); Jifeng Zhu, Hubei (CN); Qian Tao, Hubei (CN); Yu Ru Huang, Hubei (CN); Si Ping Hu, Hubei (CN); Lan Yao, Hubei (CN); Li Hong Xiao, Hubei (CN); A Man Zheng, Hubei (CN); Kun Bao, Hubei (CN); Haohao Yang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 257 days.

(21) Appl. No.: 17/447,456

(22) Filed: Sep. 13, 2021

(65) Prior Publication Data

US 2023/0084008 A1    Mar. 16, 2023

Related U.S. Application Data

(63) Continuation of application No. 16/885,858, filed on May 28, 2020, now Pat. No. 11,145,666, which is a
(Continued)

(30) Foreign Application Priority Data

Aug. 28, 2017    (CN) .......................... 201710750398.4

(51) Int. Cl.
H10B 41/35    (2023.01)
H01L 21/027    (2006.01)
(Continued)

(52) U.S. Cl.
CPC ......... *H10B 41/35* (2023.02); *H01L 21/0273* (2013.01); *H01L 21/31144* (2013.01);
(Continued)

(58) Field of Classification Search
None
See application file for complete search history.

(56) References Cited

U.S. PATENT DOCUMENTS 9,006,884 B2    4/2015    Lee et al.
9,331,082 B2    5/2016    Lee et al.
(Continued)

FOREIGN PATENT DOCUMENTS

CN    104810373 A  *   7/2015    ......... B21B 45/0275
CN    106601746 A       4/2017
(Continued)

OTHER PUBLICATIONS

International Search Report and Written Opinion of the International Searching Authority directed to related International Patent Application No. PCT/CN2018/098962, dated Nov. 7, 2018; 8 pages.

*Primary Examiner* — Scott B Geyer
(74) *Attorney, Agent, or Firm* — Sterne, Kessler, Goldstein & Fox P.L.L.C.

(57) ABSTRACT

A semiconductor structure is disclosed. The semiconductor structure includes a staircase structure disposed over a substrate. The staircase structure includes a plurality of layer stacks, where each layer stack is made of a first material layer over a portion of a second material layer. The staircase structure further includes a plurality of landing pads, where each landing pad is disposed over another portion of the second material layer of a respective layer stack.

20 Claims, 10 Drawing Sheets

Related U.S. Application Data continuation of application No. 16/126,956, filed on Sep. 10, 2018, now Pat. No. 10,680,003, which is a continuation of application No. PCT/CN2018/098962, filed on Aug. 6, 2018.

(51) Int. Cl.

| | |
|---|---|
| *H01L 21/311* | (2006.01) |
| *H01L 21/768* | (2006.01) |
| *H01L 23/528* | (2006.01) |
| *H01L 23/532* | (2006.01) |
| *H01L 23/535* | (2006.01) |
| *H10B 41/41* | (2023.01) |
| *H10B 43/27* | (2023.01) |
| *H10B 43/35* | (2023.01) |
| *H10B 43/50* | (2023.01) |

(52) U.S. Cl.
CPC .. *H01L 21/76805* (2013.01); *H01L 21/76816* (2013.01); *H01L 21/76895* (2013.01); *H01L 23/5283* (2013.01); *H01L 23/53209* (2013.01); *H01L 23/53242* (2013.01); *H01L 23/53257* (2013.01); *H01L 23/535* (2013.01); *H10B 41/41* (2023.02); *H10B 43/27* (2023.02); *H10B 43/35* (2023.02); *H10B 43/50* (2023.02)

(56) References Cited

U.S. PATENT DOCUMENTS

| | | | |
|---|---|---|---|
| 9,343,452 B2 | 5/2016 | Yun et al. | |
| 9,373,540 B2 | 6/2016 | Hyun | |
| 9,419,013 B1 | 8/2016 | Lee et al. | |
| 9,478,487 B2 | 10/2016 | Yang et al. | |
| 9,520,402 B1 | 12/2016 | Haller et al. | |
| 9,711,603 B2 | 7/2017 | Lim et al. | |
| 9,741,563 B2 | 8/2017 | Xiang et al. | |
| 9,941,153 B1 | 4/2018 | Yang | |
| 10,002,880 B1 | 6/2018 | Nagashima | |
| 10,395,982 B2 | 8/2019 | Nam et al. | |
| 10,403,641 B2 | 9/2019 | Kim et al. | |
| 10,680,003 B2 * | 6/2020 | Lu | H01L 21/76895 |
| 2011/0031630 A1 | 2/2011 | Hashimoto | |
| 2013/0043509 A1 | 2/2013 | Cho et al. | |
| 2013/0056818 A1 | 3/2013 | Iino et al. | |
| 2013/0270714 A1 | 10/2013 | Lee et al. | |
| 2014/0057429 A1 | 2/2014 | Oh et al. | |
| 2015/0179564 A1 * | 6/2015 | Lee | H10B 99/00 257/773 |
| 2015/0206895 A1 * | 7/2015 | Oh | H01L 23/5283 257/324 |
| 2015/0255385 A1 | 9/2015 | Lee et al. | |
| 2015/0255386 A1 | 9/2015 | Lee et al. | |
| 2015/0287710 A1 * | 10/2015 | Yun | H10B 43/35 257/314 |
| 2016/0093513 A1 * | 3/2016 | Hong | H01L 21/76877 438/696 |
| 2016/0172296 A1 * | 6/2016 | Lim | H01L 29/4234 257/773 |
| 2016/0218107 A1 * | 7/2016 | Lee | H01L 23/528 |
| 2016/0276262 A1 * | 9/2016 | Ishimura | H01L 21/76805 |
| 2016/0358855 A1 * | 12/2016 | Oh | H01L 23/5226 |
| 2017/0084532 A1 | 3/2017 | Son et al. | |
| 2017/0148805 A1 | 5/2017 | Nishikawa et al. | |
| 2017/0194255 A1 * | 7/2017 | Oh | H01L 21/76829 |
| 2017/0271256 A1 | 9/2017 | Inatsuka | |
| 2017/0338240 A1 * | 11/2017 | Nogami | H10B 43/35 |
| 2018/0053686 A1 * | 2/2018 | Hyun | H10B 43/50 |
| 2018/0130701 A1 | 5/2018 | Chun et al. | |
| 2018/0166380 A1 | 6/2018 | Park et al. | |
| 2018/0277558 A1 * | 9/2018 | Lee | H10B 43/30 |
| 2018/0301460 A1 | 10/2018 | Yoo et al. | |
| 2019/0006385 A1 | 1/2019 | Kim et al. | |
| 2019/0081070 A1 | 3/2019 | Lu et al. | |
| 2019/0280001 A1 | 9/2019 | Terasawa et al. | |
| 2020/0035553 A1 * | 1/2020 | Yatsuda | H10B 41/50 |

FOREIGN PATENT DOCUMENTS

| | | | |
|---|---|---|---|
| CN | 107644876 A | 1/2018 | |
| KR | 20110015338 A | 2/2011 | |
| WO | WO-2017034709 A1 * | 3/2017 | H01L 23/528 |

\* cited by examiner

STAIRCASE STRUCTURE FOR MEMORY DEVICE

CROSS-REFERENCE TO RELATED APPLICATIONS

This application is a continuation of U.S. Non-provisional Patent Application Ser. No. 16/885,858, titled "Staircase Structure for Memory Device," filed on May 28, 2020, which is a continuation of U.S. Non-provisional patent application Ser. No. 16/126,956, titled "Staircase Structure for Memory Device," filed on Sep. 10, 2018 and issued as U.S. Pat. No. 10,680,003 on Jun. 9, 2020, which claims priority to PCT Application No. PCT/CN2018/098962 filed on Aug. 6, 2018, which claims priority to Chinese Patent Application No. 201710750398.4 filed on Aug. 28, 2017, the entire contents of which are incorporated herein by reference.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral devices for controlling signals to and from the memory array. The 3D memory architecture also includes a stack of word lines horizontally arranged over a substrate, with vertical semiconductor channels that intersect the word lines. The intersection of a word line and a vertical semiconductor channel forms a memory cell.

BRIEF SUMMARY

Embodiments of the present disclosure are directed to a staircase structure for a memory device (e.g., 3D memory device). The disclosed embodiments provide numerous benefits including, but not limiting to, yield and manufacturing cost improvements.

In some embodiments, a semiconductor structure includes a staircase structure disposed over a substrate. The staircase structure includes a plurality of layer stacks, where each layer stack includes a first material layer disposed over a first portion of a second material layer. The staircase structure further includes a plurality of landing pads respectively disposed on the plurality of layer stacks, where each landing pad is disposed over a second portion of the second material layer of a respective layer stack. Each of the landing pads is adjacent to a respective side of the first material layer and extends over a respective top surface of the second material layer. The first material layer is made of an insulating material, including silicon oxide, aluminum oxide or a combination thereof. The second material layer is made of a first conductive material. The plurality of landing pads are made of a second conductive material. The first conductive material can be the same or different from the second material. Each of the first and the second conductive materials includes tungsten, silicide, nickel, titanium, platinum, aluminum, titanium nitride, tantalum nitride, tungsten nitride, or a combination thereof. The second material layer of each layer stack is disposed over a portion of the first material layer of an adjacent layer stack. One of the plurality of landing pads is thicker than the first material layer of a corresponding layer stack and is insulated from another landing pad disposed on an adjacent layer stack.

In some embodiments, a method for forming a semiconductor structure includes forming a plurality of layer stacks over a substrate, where each layer stack includes a first material layer over a portion of a second material layer. The method further includes forming a hard mask layer over the plurality of layer stacks, forming a staircase structure on the plurality of layer stacks to expose a portion of the first material layer of each layer stack, forming a landing pad over a portion of the second material layer of the each layer stack, and removing the portion of the hard mask layer. The method further includes removing the landing pad and the second material layer of the each layer stack to form a recess in each layer stack, disposing a conductive material in the recess of each layer stack, and forming a dielectric layer over the staircase structure. The formation of the landing pad includes removing a portion of the second material layer from a side of each layer stack to form a recess, disposing a material layer over the staircase structure to fill the recess in each layer stack and removing a portion of the material layer to form a spacer at the side of each layer stack and a side of the portion of the hard mask layer. The formation of the landing pad further includes removing a portion of the first material layer of each layer stack using the spacer and the portion of the hard mask layer as a mask, disposing a dielectric layer over the staircase structure and removing the spacer and a portion of the dielectric layer. The disposing of the dielectric layer over the staircase structure includes disposing the dielectric layer over a portion of the second material layer, a portion of a side of the first material layer and a portion of a side of the spacer. The removing of the portion of the hard mask and the portion of the top layer stack in the plurality of layer stacks includes using dry etching, wet etching or a combination thereof. The trimming the mask stack include etching the mask stack incrementally and inwardly from a boundary of the mask stack. The removing of the portion of the hard mask includes using a wet etch process with tetramethylammonium hydroxide (TMAH), potassium hydroxide (KOH), a base, or a combination thereof. The formation of each layer stack and the hard mask layer includes deposition techniques using chemical vapor deposition (CVD), physical vapor deposition (PVD), plasma-enhanced CVD (PECVD), low pressure CVD (LPCVD), sputtering, metal-organic chemical vapor deposition (MOCVD), atomic layer deposition (ALD), or a combination thereof.

In some embodiments, a memory device includes a memory string disposed over the substrate and a staircase structure disposed adjacent to the memory string. The staircase structure includes a plurality of layer stacks, where each layer stack of the plurality of layer stacks includes an insulating layer disposed over a first portion of the a conductive layer, where a second portion of the conductive layer is in contact with a side surface of the insulating layer. The conductive layer of the each layer stack is disposed over a portion of the insulating layer of an adjacent layer stack. The second portion of the conductive layer is thicker than the first portion of the conductive material layer.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the art to make and use the present disclosure.

DETAILED DESCRIPTION

Although specific configurations and arrangements are discussed, it should be understood that this is done for illustrative purposes only. A person skilled in the art will recognize that other configurations and arrangements can be used without departing from the spirit and scope of the present disclosure. It will be apparent to a person skilled in the art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

The meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a top surface and a bottom surface. The top surface of the substrate is where a semiconductor device is formed, and therefore the semiconductor device is formed at a top side of the substrate. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate.

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In some embodiments, a NAND string or a 3D memory device includes a semiconductor channel (e.g., a silicon channel) that extends vertically through a plurality conductor/dielectric layer pairs, where the semiconductor channel is surrounded by a dielectric stack. The plurality of conductor/dielectric layer pairs are also referred to herein as an "alternating conductor/dielectric stack." The conductor layer of the alternating conductor/dielectric stack can be used as a word line (e.g., to electrically connect one or more control gates). An intersection of a word line and the semiconductor channel forms a memory cell. Vertically-oriented memory strings require an electrical connection between a word line and an access line (e.g., back end of line (BEOL) interconnection) to select a memory cell along the memory string for read and write functions, where the electrical connection is provided by forming a staircase structure at the plurality of conductor/dielectric pairs.

The 3D memory device can include a plurality of staircase structures disposed adjacent to a plurality of memory strings for word line fan-out, according to some embodiments. As the demand for higher storage capacity continues to increase, the number of vertical levels of the staircase structures also increases. As a result, when applying a BEOL process to form interconnects on the staircase structures, an upper portion of the staircase structures is exposed to the BEOL process for a longer period of time than a lower portion of the staircase structures. This differential in BEOL exposure time increases the process variation of the final 3D memory device, thus introducing challenges in balancing manufacturing yield and process complexity/cost.

In the present disclosure, a staircase structure refers to a set of surfaces that include at least two horizontal surfaces (e.g., along an x-y plane) and at least two vertical surfaces (e.g., along a z-axis). Each horizontal surface is adjoined to a first vertical surface that extends upward from a first edge of the horizontal surface, and is also adjoined to a second vertical surface that extends downward from a second edge of the horizontal surface. Each of the horizontal surfaces is referred as a "step" or "stair" of the staircase structure. A horizontal direction can refer to a direction (e.g., the x-axis or the y-axis) parallel with a top surface of the substrate (e.g., the substrate that provides the fabrication platform for formation of structures over it). A vertical direction can refer to a direction (e.g., the z-axis) perpendicular to the top surface of the structure.

The staircase structure can be formed from a plurality of layer stacks by repetitively etching and trimming the each layer stack using a mask layer, where each layer stack is also referred to as a "staircase layer" (or "SC layer") of the staircase structure in the present disclosure. A step of the staircase structure exposes a portion of a top surface of a layer stack (e.g. a SC layer) of the plurality of layer stacks. In some embodiments, the staircase structure includes a plurality of layer stacks.

Figure 1:
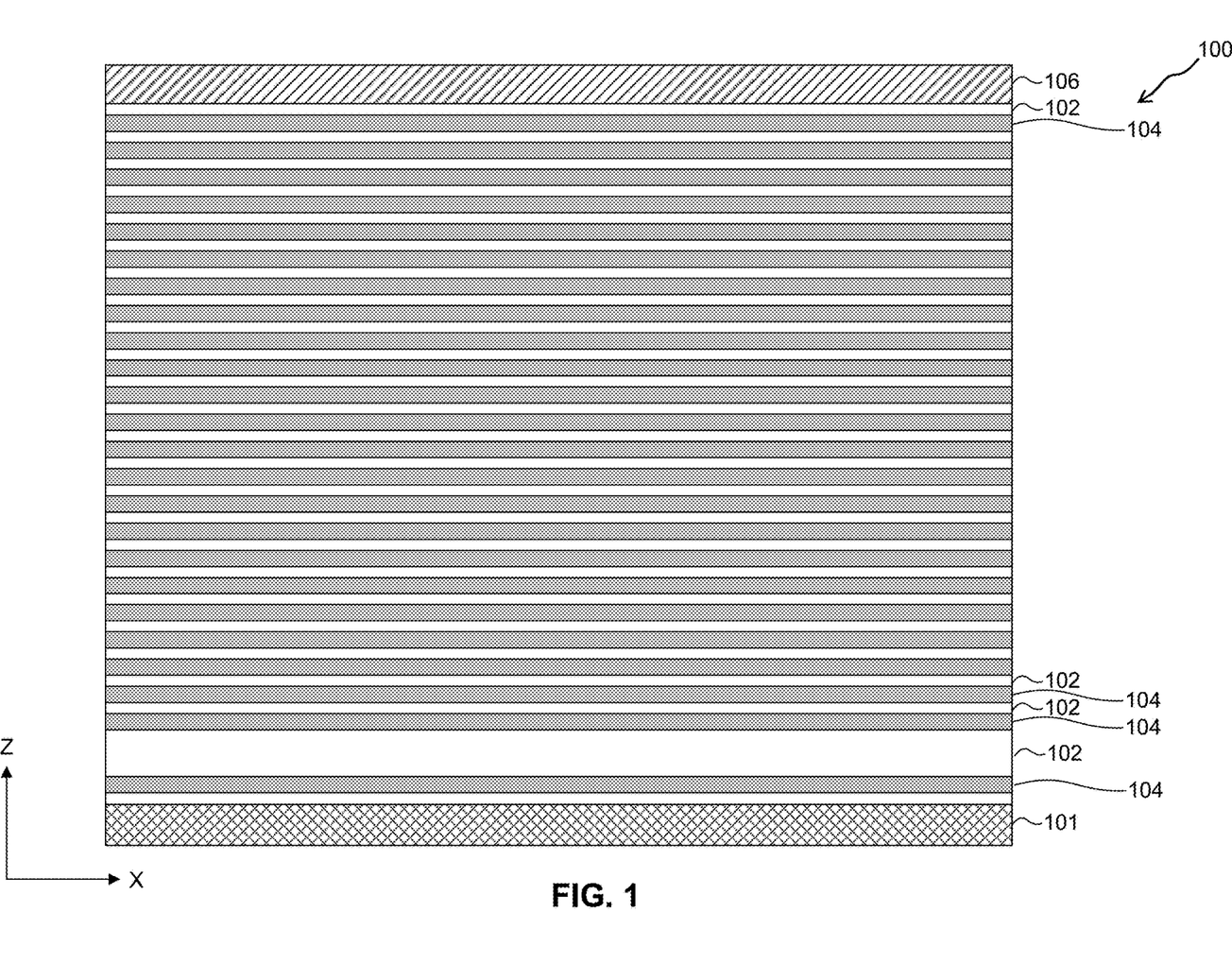
FIG. 1 illustrates a cross-sectional view of a hard mask layer and a plurality of dielectric layer pairs over a substrate, according to some embodiments.

FIG. 1 illustrates a structure 100 with an alternating layer stack formed over a substrate 101 and a hard mask layer 106 formed over the alternating layer stack. A layer stack within the alternating layer stack can include a dielectric layer pair with an insulating layer 102 over a sacrificial layer 104. In some embodiments, sacrificial layer 104 can be disposed over insulating layer 102. Insulating layer 102 can include silicon oxide. Sacrificial layer 104 can include silicon nitride. In some embodiments, a thickness of insulating layer 102 or sacrificial layer 104 is between 10 nm and 200 nm. In some embodiments, a thickness of hard mask layer 106 is between 10 nm and 200 nm. In some embodiments, the layers in the alternating layer stack can be different thicknesses.

In some embodiments, substrate 101 includes any suitable material for supporting a memory structure (e.g., 3D memory structure). For example, substrate 101 can include silicon, silicon germanium, silicon carbide, silicon on insulator (SOI), germanium on insulator (GOI), glass, gallium nitride, gallium arsenide, any suitable III-V compounds, any other suitable material, or combinations thereof.

In some embodiments, sacrificial layer 104 can include any suitable material different from insulating layer 102. For example, sacrificial layer 104 can include poly-crystalline silicon, silicon nitride, poly-crystalline germanium, poly-crystalline germanium-silicon, any other suitable materials, or combinations thereof. In some embodiments, sacrificial layer 104 can include silicon nitride.

Insulating layer 102 can include any suitable insulating materials, such as silicon oxide or aluminum oxide.

In some embodiments, sacrificial layer 104 can be a conductive material layer. The conductive material layer can include any suitable conductive material. In some embodiments, the conductive material layer can include poly-crystalline silicon, tungsten, silicide, nickel, titanium, platinum, aluminum, titanium nitride, tantalum nitride, tungsten nitride, any other suitable material, or combinations thereof.

In some embodiments, hard mask layer 106 can be a poly-crystalline semiconductor layer including poly-crystalline silicon, poly-crystalline germanium, poly-crystalline germanium-silicon, any other suitable material, or combinations thereof. In some embodiments, hard mask layer 106 can be a metal layer, including cobalt, nickel, tungsten, copper, or silver. In some embodiments, hard mask layer 106 can be a metal silicide layer, including $CoSi_x$, $NiSi_x$, or $WSi_x$. In some embodiments, hard mask layer 106 can be an organic material layer formed by spin-coating or self-assembling of organic molecules.

The formation of insulating layer 102, sacrificial layer 104, and hard mask layer 106 can include any suitable deposition methods such as, for example, chemical vapor deposition (CVD), physical vapor deposition (PVD), plasma-enhanced CVD (PECVD), low pressure chemical vapor deposition (LPCVD), sputtering, metal-organic chemical vapor deposition (MOCVD), atomic layer deposition (ALD), sputtering, thermal evaporation, e-beam evaporation, molecular beam-epitaxy (MBE), any other suitable deposition method, or combinations thereof. In some embodiments, insulating layer 102, sacrificial layer 104, the conductive material layer, and hard mask layer 106 are each formed by CVD. In some embodiments, the formation of hard mask layer 106 further includes applying a thermal anneal process to form a silicide layer.

Figure 2A:
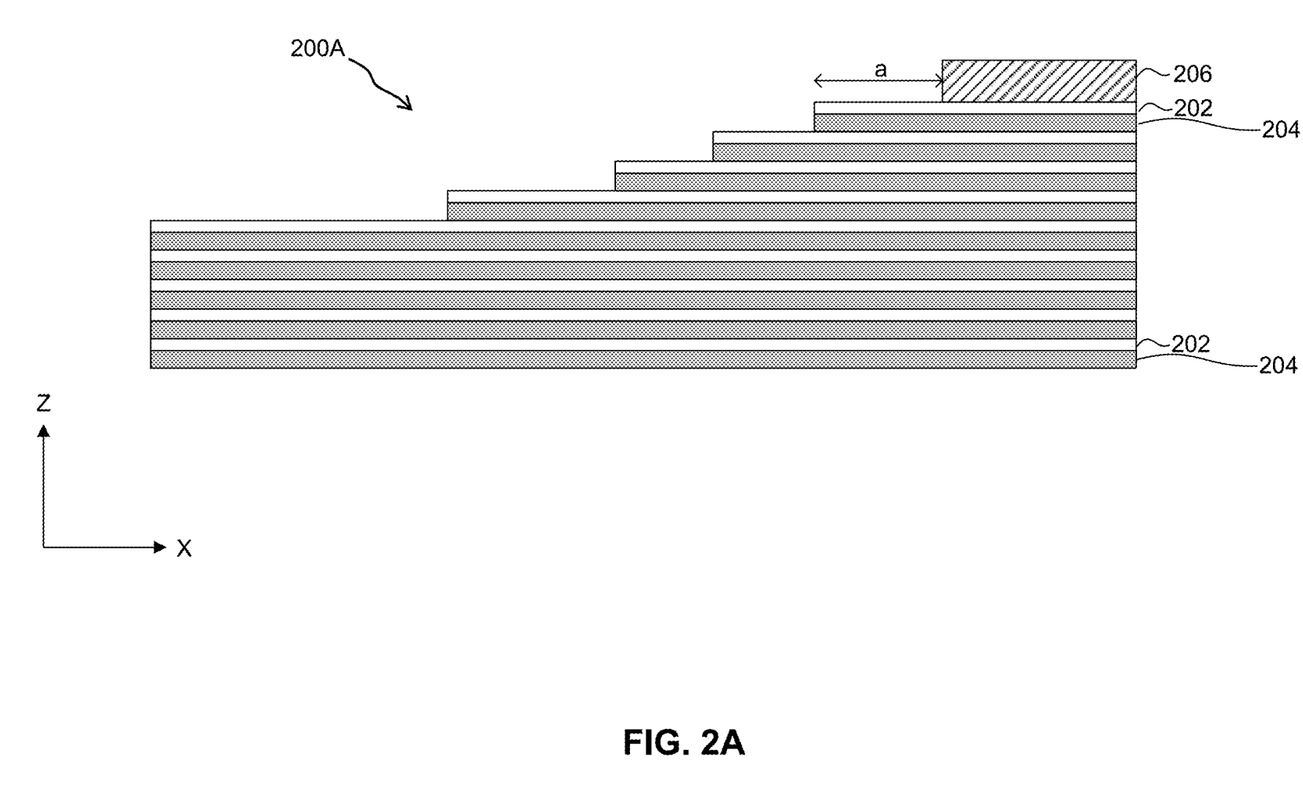
FIG. 2A illustrates a cross-sectional view of a staircase structure, according to some embodiments.
Figure 2B:
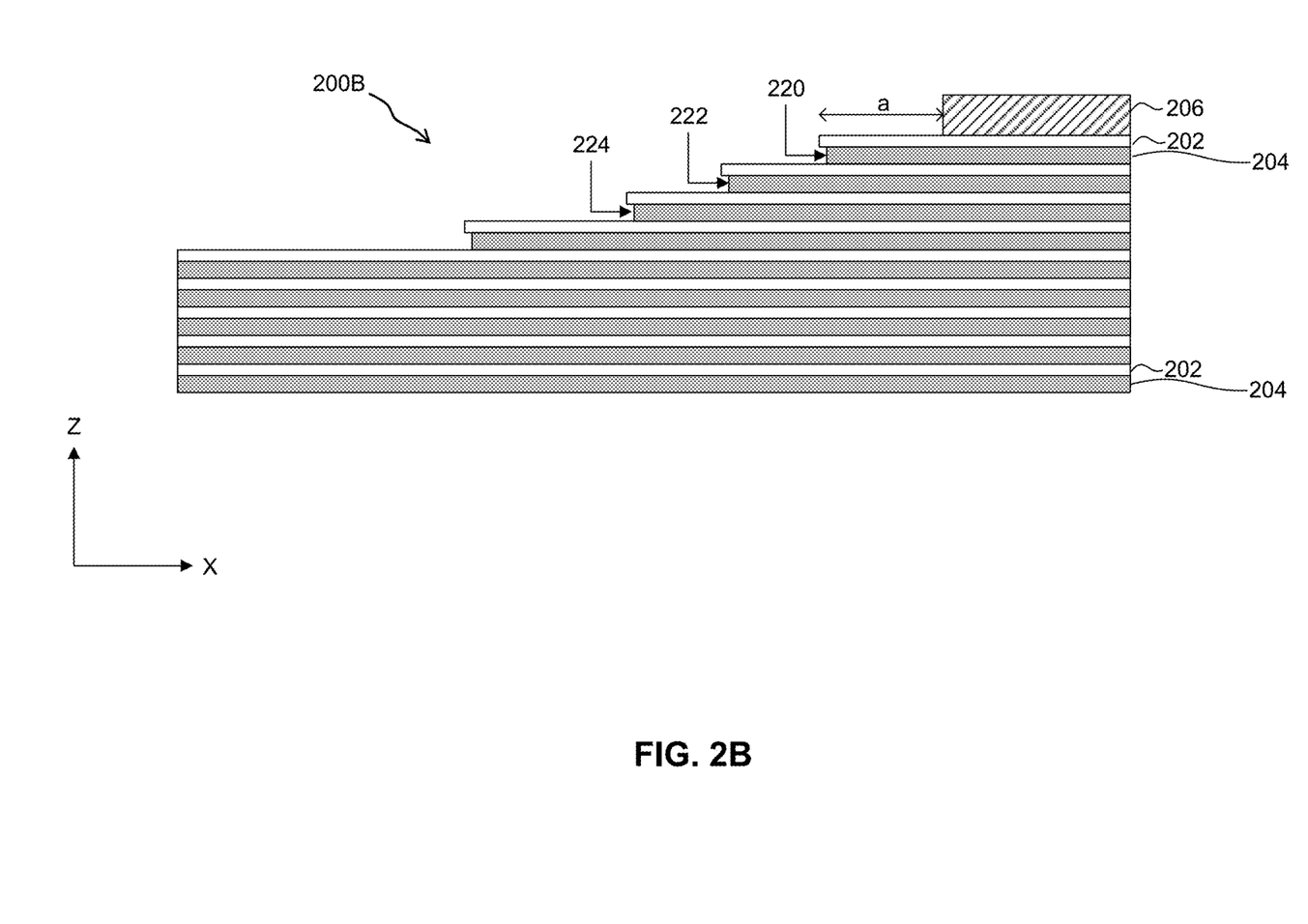
FIG. 2B illustrates a cross-sectional view of a staircase structure, according to some embodiments.

FIGS. 2A-2B illustrate a cross-sectional view of staircase structures 200A and 200B, according to some embodiments. Staircase structure 200A includes a hard mask 206 and a plurality of layer stacks 202/204. Each layer stack 202/204 is also referred to herein as an "SC layer." The steps in staircase structure 200A is formed by repeating an etch-trim process on structure 100 using a mask stack (not shown). After the formation of the steps, the mask stack is removed. In some embodiments, a step exposes a portion of a top surface of an SC layer. In some embodiments, a step exposes a side of a SC layer. In some embodiments, after repeating the etch-trim process, a portion of a top-most SC layer of staircase structure 200A is exposed and another portion of the top-most SC layer is covered by hard mask layer 206. An etch process is also applied to laterally etch a portion of sacrificial layer 204 of each SC layer. As a result, each step of staircase structure 200B has a recess (e.g. recess 220, 222, 224 . . . , etc.). In some embodiments, a lateral dimension of each recess is between 10 nm and 300 nm. In some embodiments, a lateral dimension "a" of each step is between 100 nm and 1500 nm.

In some embodiments, the mask stack (not shown in FIG. 2A) can include a photoresist or carbon-based polymer material. In some embodiments, the mask stack is removed after forming staircase structure 200A. The etch-trim process includes an etch process and a trim process. In some embodiments, the etch process includes using any suitable etchants (e.g., wet etch and/or dry etch) to sequentially remove a portion of hard mask layer 106 and a portion of the layer stack, including a portion of insulating layer 102 and a portion of sacrificial layer 104. For example, as shown in FIG. 2A, hard mask layer 206, insulating layer 202, and sacrificial layer 204 are formed after removing a portion of hard mask layer 106, a portion of insulating layer 102, and a portion of sacrificial layer 104.

In the etch process, an etchant for insulating layer 102 has a higher etching selectivity over sacrificial layer 104, and/or vice versa. In some embodiments, the etchant for hard mask layer 106 has a higher etching selectivity over insulating layer 102 and sacrificial layer 104, and/or vice versa. Accordingly, an underlying layer stack can function as an etch-stop layer so that a single layer stack is patterned/etched, according to some embodiments. In some embodiments, insulating layer 102 and sacrificial layer 104 are etched using an anisotropic etch process, such as reactive ion etch (RIE) or other dry etch process. In some embodiments, the etchant includes carbon-fluorine ($CF_4$) based gases or hexafluoroethane ($C_2F_6$) based gases. In some embodiments, an etchant includes phosphoric acid and can be used to remove both insulating layer 102 and sacrificial layer 104. The methods and etchants to remove the layer stack described herein are exemplary. Other methods and etchants are within the spirit and scope of the present disclosure.

The trim process includes applying a suitable etch process (e.g., an isotropic dry etch or a wet etch) on the mask stack at directions parallel to a surface of the substrate. The mask stack is etched incrementally and inwardly from a boundary of the mask stack. The amount of trimmed mask stack can be related to the lateral dimension "a" of each steps of staircase structure 200A.

The process for forming the recess structure (e.g. recess 220, 222, 224 . . . , etc.) uses an etch process similar to the etching techniques for removing sacrificial layer 104 as described above. In some embodiments, the process etches sacrificial layer 204 at a higher etching rate than that of insulating layer 202 or hard mask layer 206.

Figure 3:
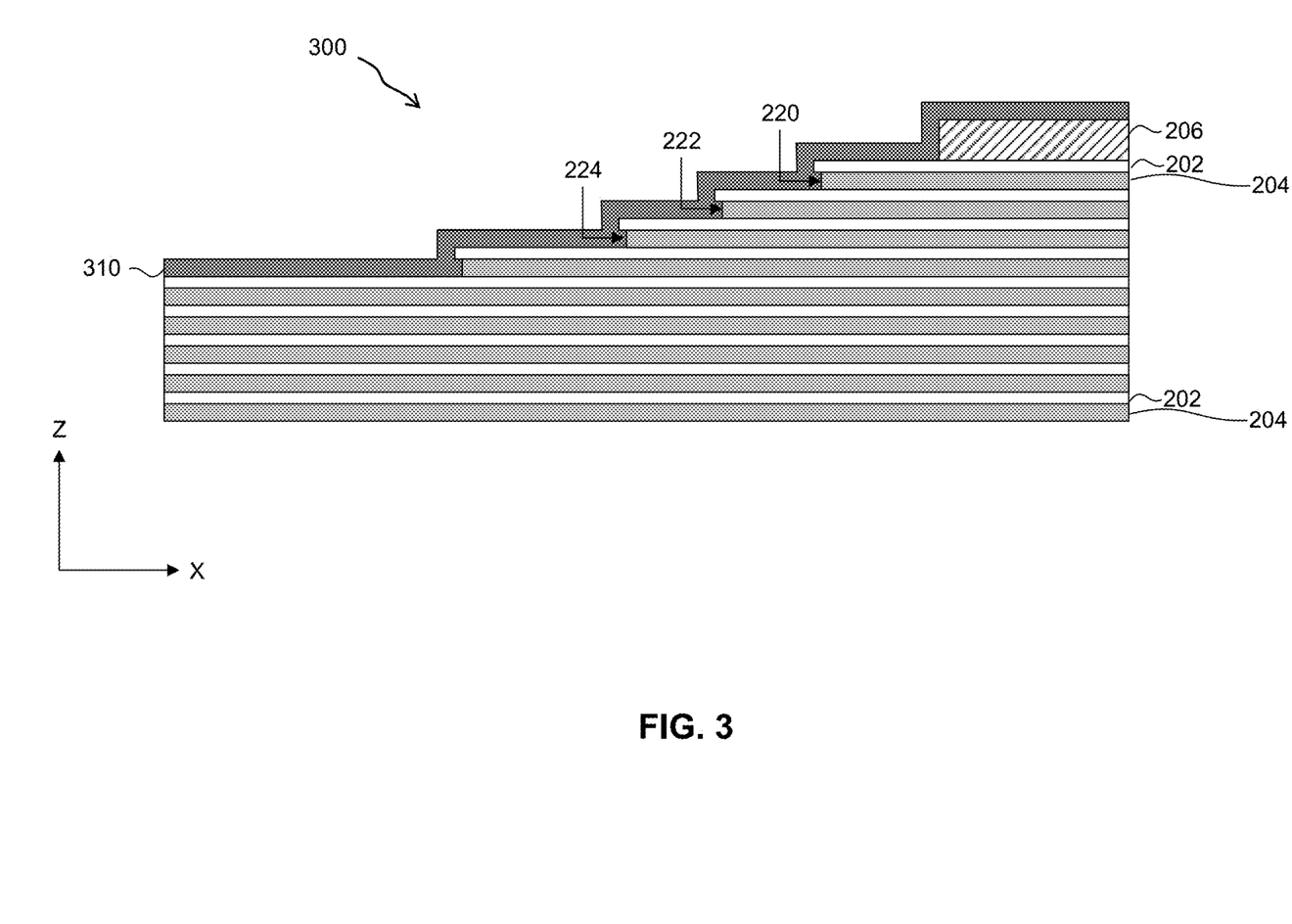
FIG. 3 illustrates a cross-sectional view of a staircase structure with a material layer disposed therein, according to some embodiments.

FIG. 3 illustrates a cross-sectional view of a staircase structure 300 with a material layer 310 disposed thereon, according to some embodiments. Material layer 310 is conformally disposed on staircase structure 200B, including on a top surface of hard mask layer 206, a side of hard mask layer 206, a top surface of each SC layer (e.g. each step) of staircase structure 200B, and a recess of the each SC layer. In some embodiments, material layer 310 fills each recesses of staircase structure 200B. Material layer 310 can be made of similar material as hard mask layer 106, where the formation of material layer 310 can be similar to that of hard mask layer 106. In some embodiments, a thickness of material layer 310 is thicker than that of sacrificial layer 204. In some embodiments, a thickness of material layer 310 is thinner than that of the SC layer.

Figure 4:
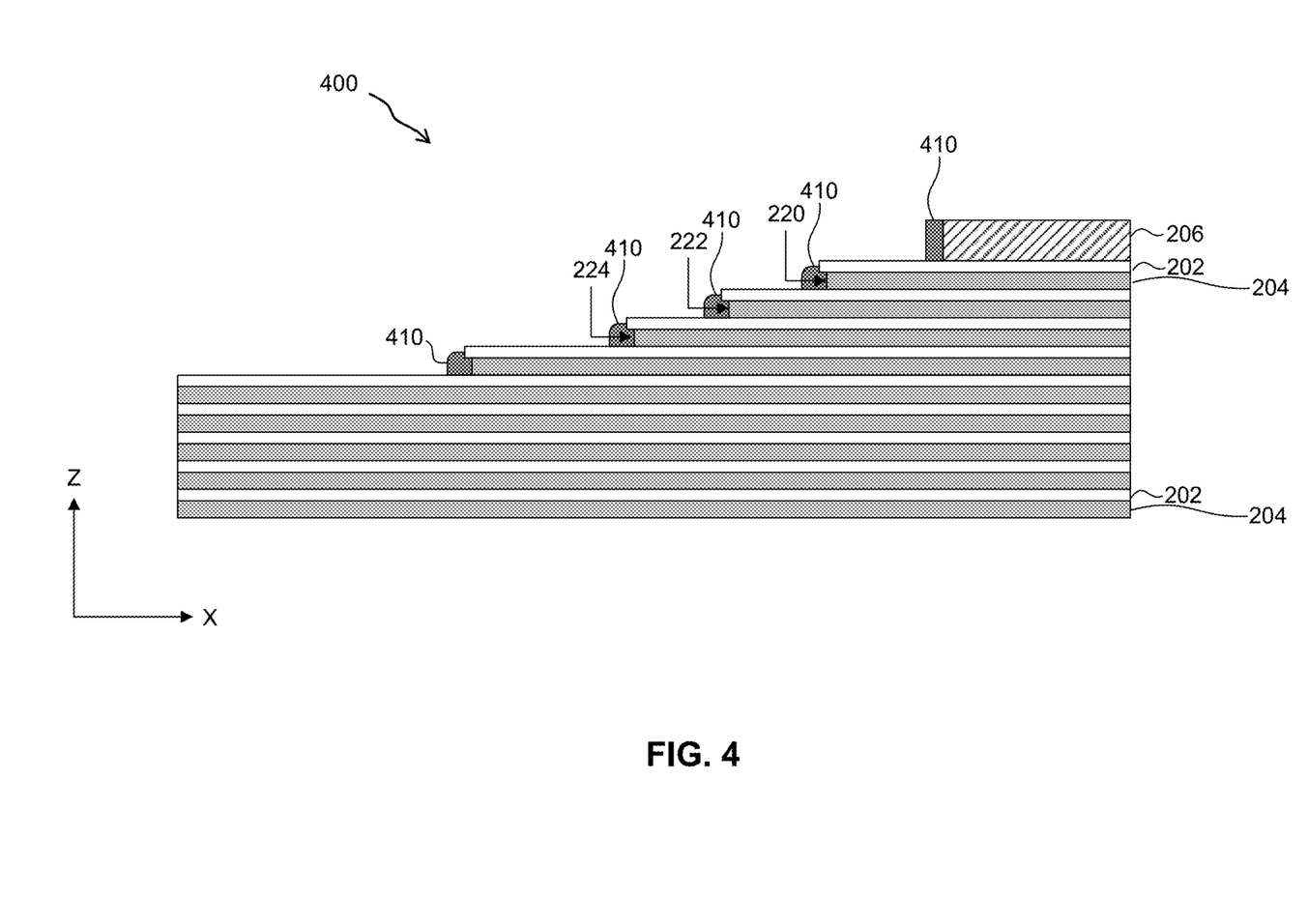
FIG. 4 illustrates a cross-sectional view of a staircase structure with spacers, according to some embodiments.

FIG. 4 illustrates a cross-sectional view of a staircase structure 400 with spacers 410, according to some embodiments. Each of spacers 410 is formed at a side of each SC layer of staircase structure 300. In some embodiments, spacer 410 is formed at a side of hard mask layer 206. Spacer 410 is formed by removing a portion of material layer 310 from staircase structure 300 using similar techniques as removing hard mask layer 106. In some embodiments, material layer 310 is removed from a top surface of staircase structure 300 and a top surface of hard mask layer 206. In some embodiments, spacer 410 fills a recess (e.g. recess 220, 222, or 224) of each SC layer of staircase structure 300. In some embodiments, spacer 410 covers a side of sacrificial layer 204 of each SC layer of staircase structure 300. In some embodiments, spacer 410 covers a portion of a side of insulating layer 202 of each SC layer of staircase structure 300. In some embodiments, spacer 410 and hard mask layer 106 are made of the same material.

Figure 5:
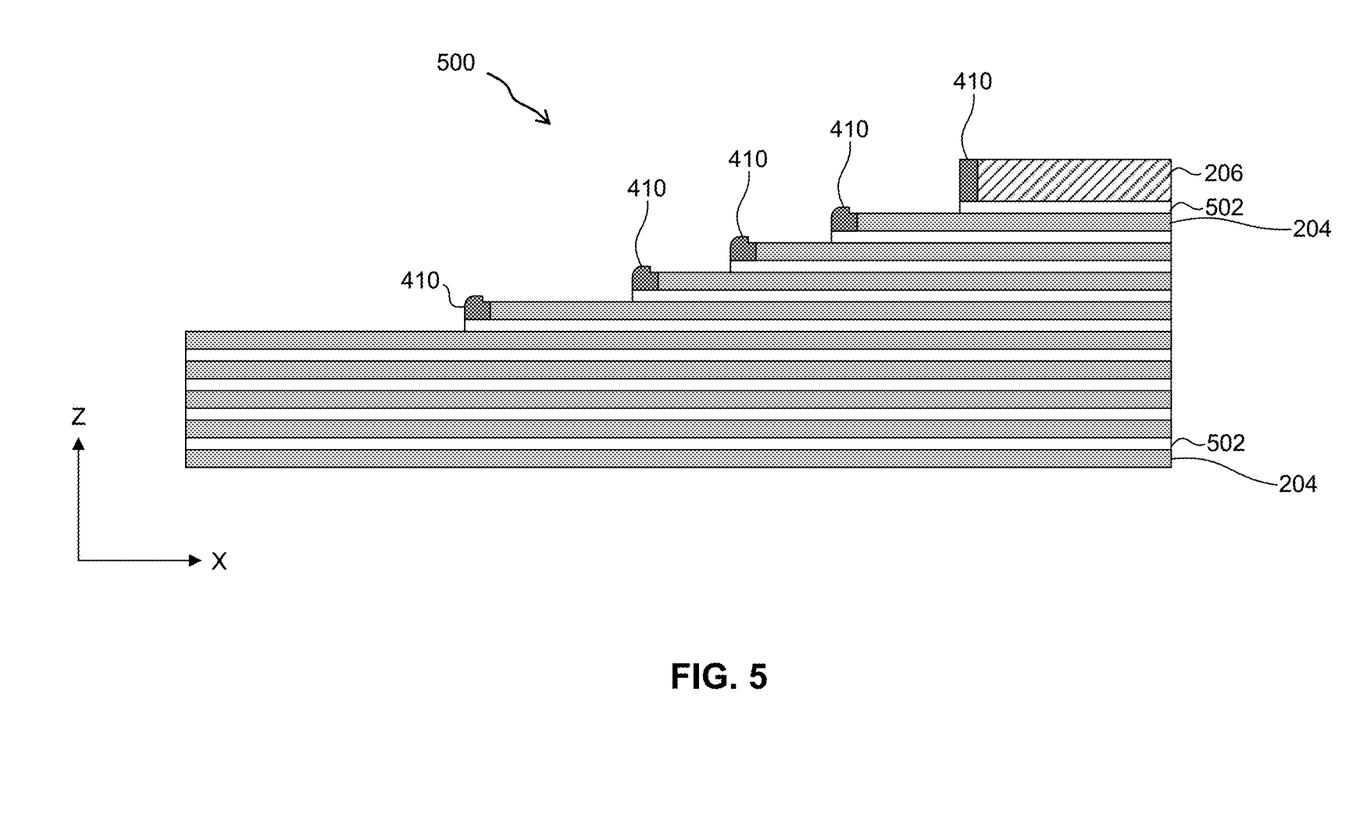
FIG. 5 illustrates a cross-sectional view of a staircase structure after removal of an insulating layer, according to some embodiments.

FIG. 5 illustrates a cross-sectional view of a staircase structure 500 after removal of a portion of insulating layer 202, according to some embodiments. In FIG. 5, the portion of insulating layer 202 of each SC layer of staircase structure 400 is removed using spacers 410 and hard mask layer 206 as masks. Insulating layer 502 is formed after removing the portion of insulating layer 202 using similar techniques as removing insulating layer 102. As illustrated in FIG. 5, each SC layer of staircase structure 500 exposes a portion of a top surface of sacrificial layer 204 and spacer 410 of each SC layer. In some embodiments, a side of insulating layer 502 of each SC layer of staircase structure 500 is exposed.

Figure 6:
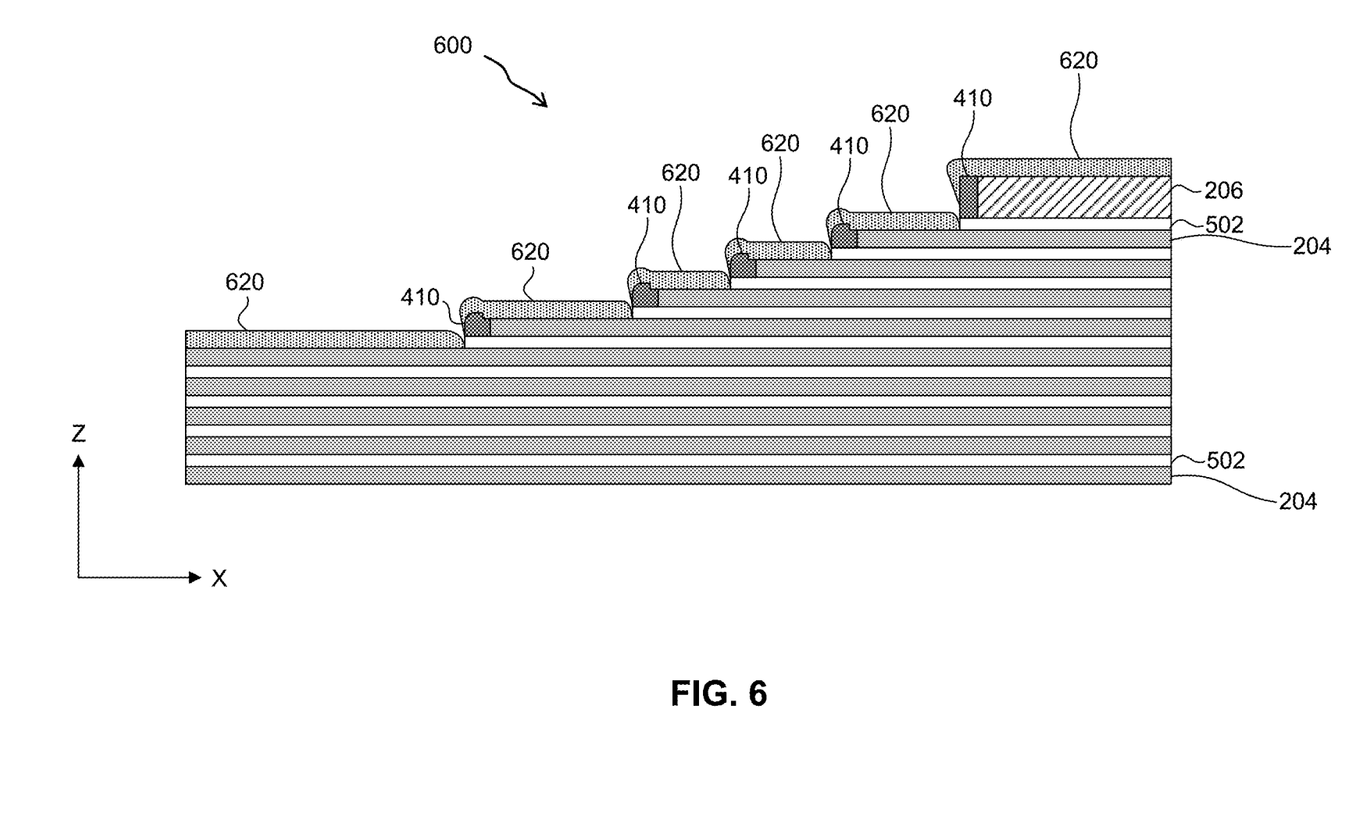
FIG. 6 illustrates a cross-sectional view of a staircase structure with a dielectric layer disposed thereon, according to some embodiments.

FIG. 6 illustrates a cross-sectional view of a staircase structure 600 with a dielectric layer 620 disposed thereon, according to some embodiments. Dielectric layer 620 covers a top surface of staircase structure 500 and a portion of a side of staircase structure 500. In some embodiments, dielectric layer 620 covers a portion of each spacer 410 of staircase structure 500. In some embodiments, dielectric layer 620 covers a top surface of hard mask layer 206, a portion of a top surface of sacrificial layer 204, and a portion of a side of insulating layers 502 of each SC layer of staircase structure 500. In some embodiments, dielectric layer 620 has poor step-coverage on staircase structure 500. For example, the poor step-coverage includes a thickness of dielectric layer 620 that is substantially thinner at a side of staircase structure 600 than that at a top surface of staircase structure 600. In some embodiments, dielectric layer 620 is discontinuous between each SC layer of staircase structure 600. In some embodiments, a portion of spacer 410 or a portion of a side of insulating layer 502 of each SC layer of staircase structure 600 is exposed.

In some embodiments, dielectric layer 620 can be a nitride layer, including silicon nitride, silicon oxynitride, any suitable materials, or combinations thereof. In some embodiments, dielectric layer 620 and each sacrificial layer 204 of staircase structure 600 are made of the same material. In some embodiments, a thickness of dielectric layer 620 at a top surface of staircase structure 600 is thinner than that of insulating layer 502 of each SC layer of staircase structure 600. Dielectric layer 620 can be formed using deposition techniques including, but not limiting to plasma-enhanced CVD (PECVD), low pressure CVD (LPCVD), physical vapor deposition (PVD), high density plasma (HDP), atomic layer deposition (ALD), any suitable deposition techniques, or combinations thereof.

Figure 7:
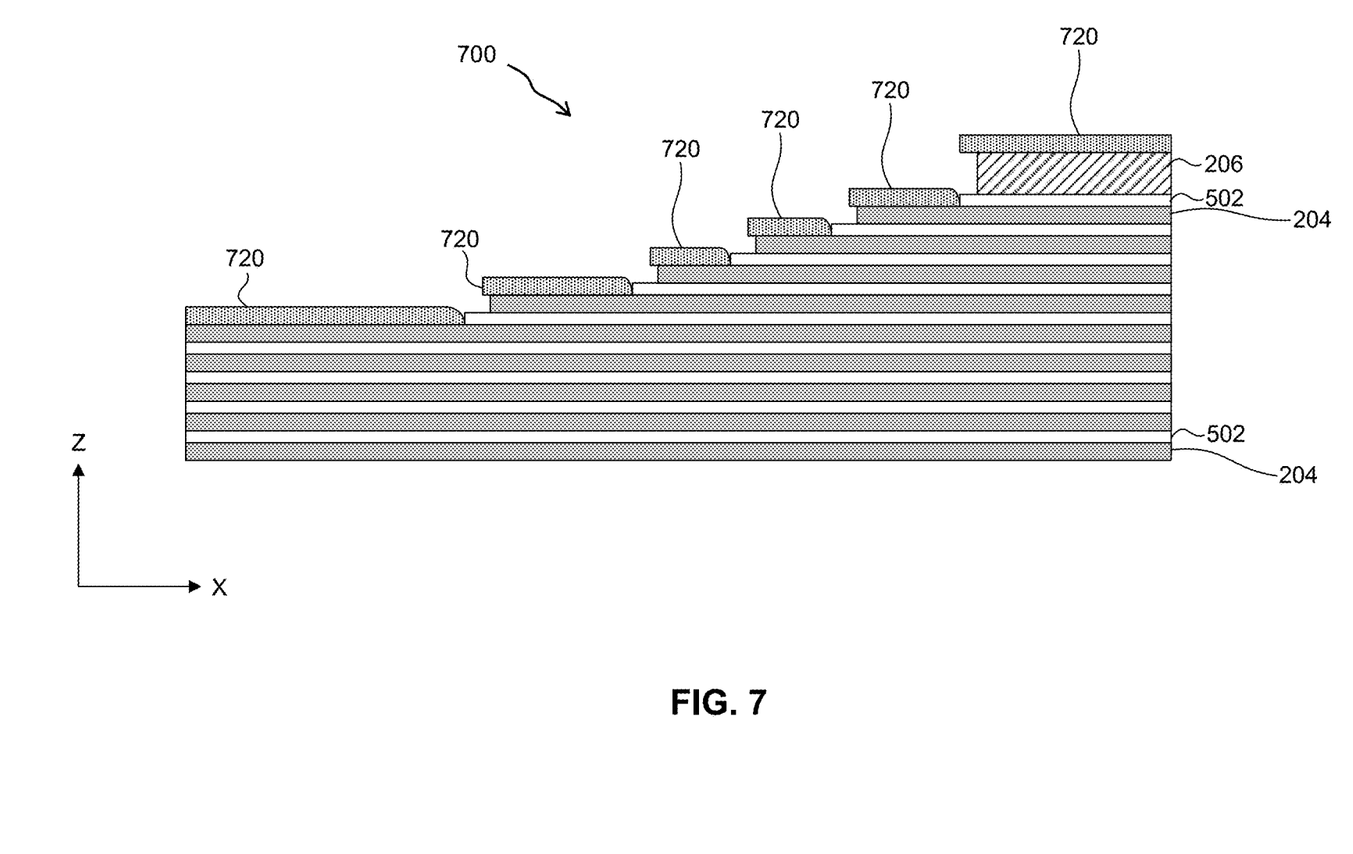
FIG. 7 illustrates a cross-sectional view of a staircase structure with landing pads, according to some embodiments.

FIG. 7 illustrates a cross-sectional view of a staircase structure 700 with landing pads 720, according to some embodiments. In FIG. 7, spacers 410 and a portion of dielectric layer 620 are removed from staircase structure 600. After removing spacers 410 and the portion of dielectric layer 620, a landing pad 720 is formed over each SC layer of staircase structure 700. As shown in FIG. 7, landing pad 720 is in contact with sacrificial layer 204 of each SC layer of staircase structure 700. Both landing pad 720 and sacrificial layer 204 of the SC layer are disposed over a portion of insulating layer 502 of another vertically adjacent SC layer. In some embodiments, landing pad 720 is formed over hard mask layer 206. In some embodiments, landing pad 720 of a SC layer is thicker than insulating layer 502 of the SC layer. Landing pad 720 can also be discontinuous from another landing pad 720 disposed on another vertically adjacent SC layer. In some embodiments, landing pad 720, dielectric layer 620 and sacrificial layer 204 are made of the same material.

Removal of spacers 410 and the portion of dielectric layer 620 can use an etch process similar to that which removes hard mask layer 106 and sacrificial layer 104, where the etch process has high etching selectivity to insulating layers 502 as described above. In some embodiments, more than two etch processes are applied to etch dielectric layer 620 and spacers 410, in which the etch processes have high etching selectivity to insulating layers.

Figure 8:
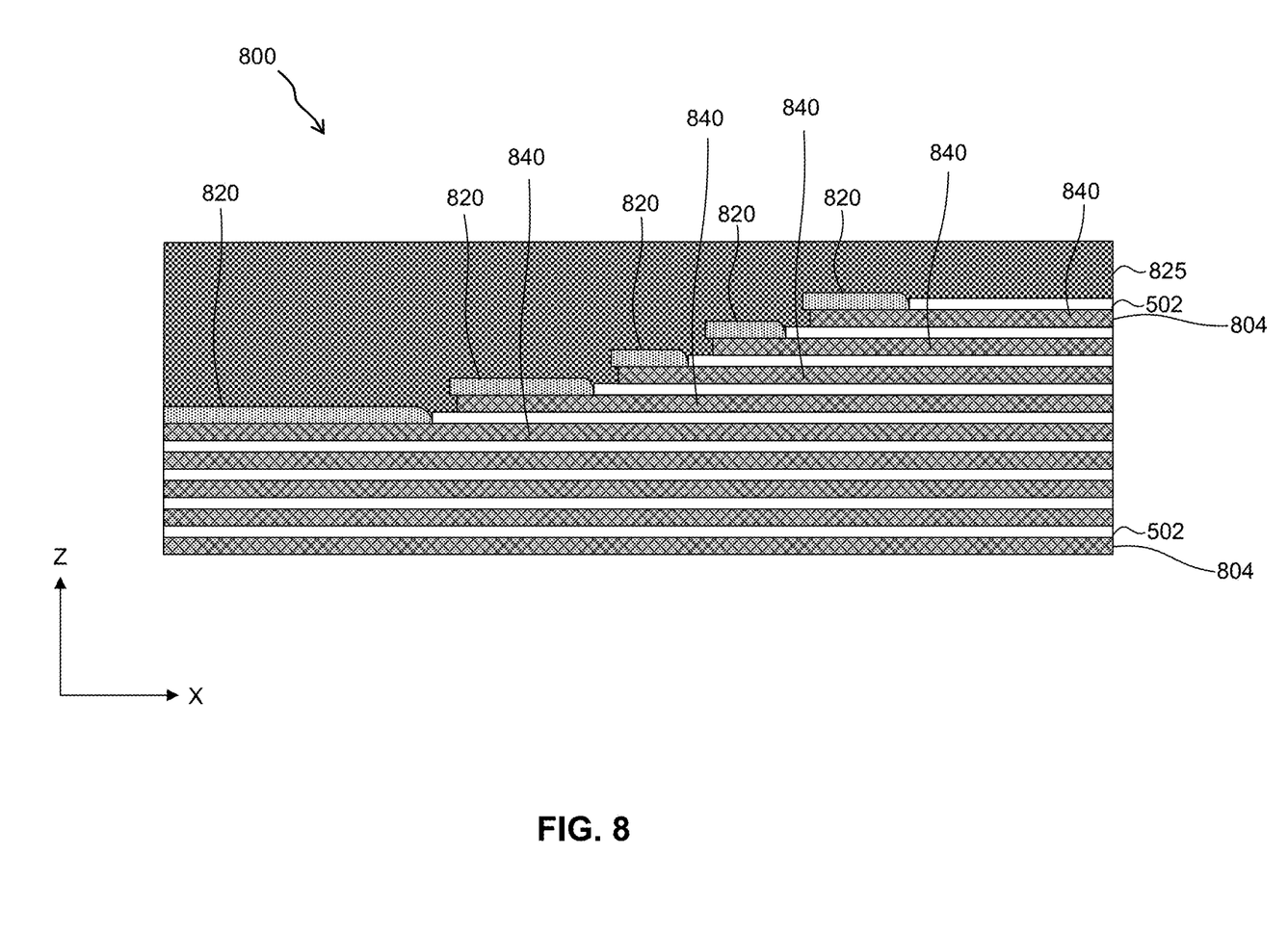
FIG. 8 illustrates a cross-sectional view of a staircase structure with a dielectric layer disposed thereon, according to some embodiments.

FIG. 8 illustrates a cross-sectional view of a staircase structure 800 with a dielectric layer 825 disposed thereon, according to some embodiments. Staircase structure 800 is formed by removing hard mask layer 206 from staircase structure 700. Further, a wordline layer 804 for each SC layer of staircase structure 800 is formed by replacing landing pad 720 and sacrificial layer 204 of each step of staircase structure 700 with one or more conducting material layers, including poly-crystalline silicon, tungsten, silicide, nickel, tungsten, titanium, platinum, aluminum, titanium nitride, tantalum nitride, tungsten nitride, any other suitable material, or combinations thereof. As shown in FIG. 8, wordline layer 804 includes landing pad 820 and conductive layer 840. Wordline layer 804 of an SC layer is disposed over a portion of insulating layer 502 of another vertically adjacent SC layer. In some embodiments, a length of wordline layer 804 is shorter in a horizontal direction (e.g., x-direction) than that of insulating layer 502 of another vertically adjacent SC layer. In some embodiments, landing pad 820 is thicker than insulating layer 502 and is insulated from another landing pad 820 disposed on another vertically adjacent SC layer. A dielectric layer 825 is disposed on staircase structure 700. Each wordline layer 804, including landing pad 820 and a conductive layer 840, of staircase structure 800 can control a portion of a memory string in the stacked storage region of a memory device (e.g., 3D memory device). In some embodiments, each wordline layer 804 of staircase structure 800 is a wordline of the memory device, where conductive layer 840 contacts a portion of a memory string of a memory device, and landing pad 820 contacts a portion of a side of insulating layer 502. In some embodiments, a thickness of landing pad structure 820 of word line 804 is thicker than that of conductive layer 840 of wordline layer 804. In some embodiments, an edge of wordline layer 804 of each step of staircase structure 800 has landing pad structure 820, where landing pad 820 is made of the same or different conductive material as conductive layer 840.

In some embodiments, hard mask layer 206 of staircase structure 700 is removed using a wet etch process. In some embodiments, an etchant used in the wet etch process includes tetramethylammonium hydroxide (TMAH). In some embodiments, a landing pad 720 over hard mask layer 206 is lifted-off after the wet etch process. In some embodiments, hard mask layer 206 is removed using similar techniques as removing hard mask layer 106.

In some embodiments, replacement of landing pad 720 and sacrificial layer 204 of each SC layer with the conductive material includes formation of one or more recesses in each SC layer by removing landing pad 720 and sacrificial layer 204 from each SC layer, followed by filling the one or more conductive material layers in the one or more recesses. The removal of landing pad 720 or sacrificial layer 204 can be similar to the techniques of removing sacrificial layer 104. In some embodiments, the removal of landing pad 720 uses different techniques from the removal of sacrificial layer 204. The filling of the conductive material can be similar to the techniques of depositing metallic hard mask layer 106. In some embodiments, the filling of a recess formed by the removal of landing pad 720 uses different techniques and/or conductive material from the filling of another recess formed by the removal of sacrificial layer 204.

In some embodiments, the formation of dielectric layer 825 uses similar techniques as forming insulating layer 102 or sacrificial layer 104. In some embodiments, the formation of dielectric layer 825 uses a spin-coating process. In some embodiments, dielectric layer 825 includes any suitable dielectric materials, such as silicon oxide or a spin-on-dielectric material. In some embodiments, the formation of dielectric layer 825 further includes a planarization process, such as chemical-mechanical planarization (CMP). In some embodiments, dielectric layer 825 is made of the same material as insulating layer 102 or sacrificial layer 104. In some embodiments, dielectric layer 825 is disposed on each step of staircase structure 800.

Figure 9:
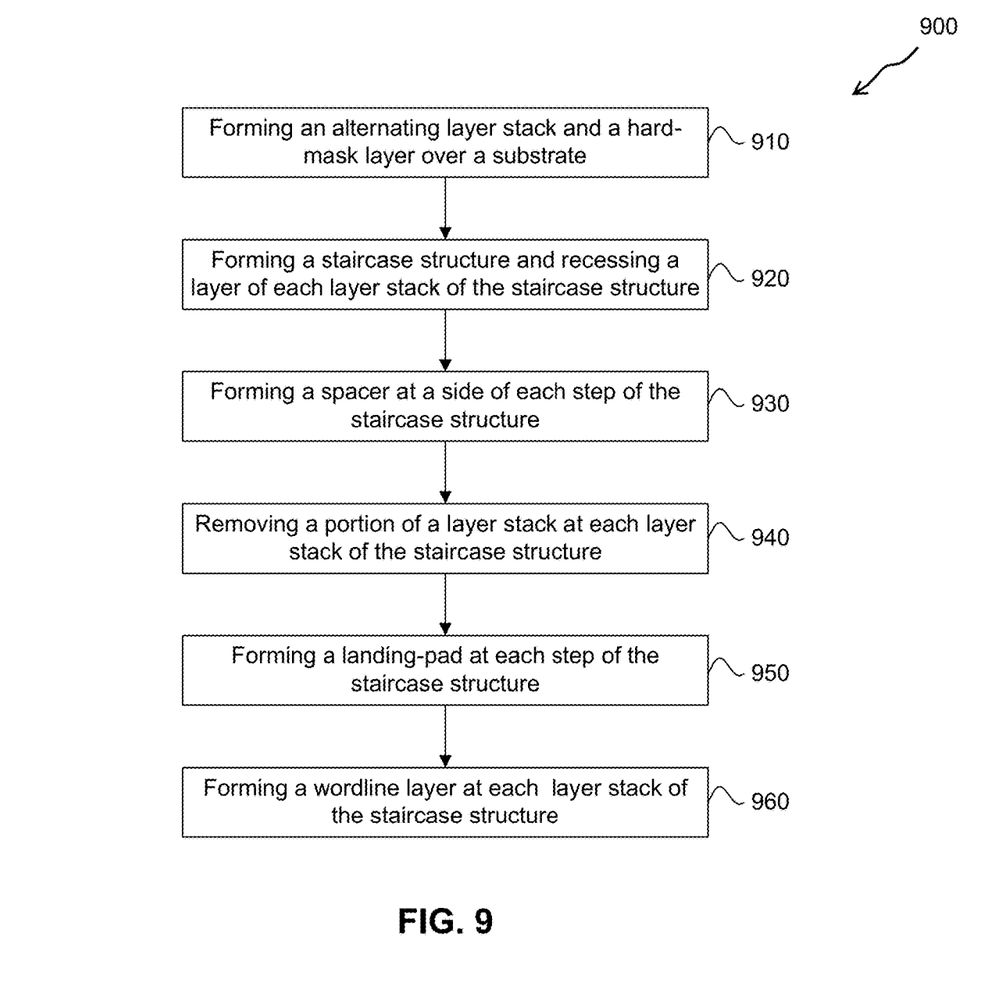
FIG. 9 is a flowchart of a method for forming a memory device, according to some embodiments.

FIG. 9 is a flowchart of a method 900 for forming a memory device (e.g., 3D memory device), according to some embodiments. The operations of method 900 can be used to form memory device structures illustrated in FIGS. 1-8. The operations shown in method 900 are not exhaustive and that other operations can be performed as well before, after, or between any of the illustrated operations. In some embodiments, some operations of exemplary method 900 can be omitted or include other operations that are not described here for simplicity. In some embodiments, operations of method 900 can be performed in a different order and/or vary.

In operation 910, an alternating stack and a hard-mask layer are formed over a substrate. The substrate can include any suitable material for forming a memory structure—e.g., a 3D memory device. For example, the substrate can include silicon, silicon germanium, silicon carbide, SOI, GOI, glass, gallium nitride, gallium arsenide, plastic sheet, and/or other suitable III-V compound.

In operation 910, a layer stack in the alternating layer stack can include a dielectric layer pair with a first material layer and a second material layer. In some embodiments, the first material layer can be an insulating layer. The second material layer can be a sacrificial layer or a conductive material layer. The sacrificial layer can include materials such as silicon nitride, poly-crystalline silicon, poly-crystalline germanium, poly-crystalline germanium-silicon, any other suitable material, or combinations thereof. The insulating layer can include silicon oxide, aluminum oxide, or other suitable materials. The conductive material layer can include tungsten, titanium nitride, tantalum nitride, tungsten nitride, any other suitable material, or combinations thereof. Each of the insulating, sacrificial, and conductive material layers can include materials formed by one or more thin film deposition processes including, but not limiting to, CVD, PVD, ALD, or any combinations thereof.

The hard mask layer can be a poly-crystalline semiconductor layer, including poly-crystalline silicon. In some embodiments, the hard mask layer can be a metal layer, such as cobalt, nickel, tungsten, copper, or silver. In some embodiments, the hard mask layer can be a silicide layer, including $CoSi_x$, $NiSi_x$, or $WSi_x$. In some embodiments, the hard mask layer can be an organic material layer. The hard mask layer can be formed using similar techniques as forming the alternating layer stack. In some embodiments, the formation of the hard mask layer includes a thermal anneal process.

In operation 920, a staircase structure is formed, where a layer of each layer stack in the staircase structure is recessed. Each step of the staircase structure can be formed by repeating an etch-trim process using a mask stack. In some embodiments, the mask stack can include a photoresist or carbon-based polymer material. The etch-trim process includes an etch process and a trim process. In some embodiments, the etch process etches a portion of the hard mask layer and a portion of the layer stack. In some embodiments, the etch process etches a portion of the hard mask layer and a portion of a plurality of layer stacks. In some embodiments, one or more etchants are used in the etch process, and each of the etchants etches the first material layer at a higher etch rate than the second material layer or the hard mask layer. In some embodiments, the one or more etchants etches one of the first material layer, second material layer and the hard mask layer at a higher etch rate than the other two of the first material layer, the second material layer and the hard mask layer. In some embodiments, the etch process can control the formation of steps of the staircase structure because high etching selectivity between the first and the second material layer allows the etch process to stop on a surface of a layer stack of the alternating layer stack.

The trim process includes a suitable etch (e.g., an isotropic dry etch or a wet etch) of the mask stack and is performed at a direction parallel to a surface of the substrate. The amount of trimmed mask stack can be related to the lateral dimensions of the staircase structure. After the repetitive etch-trim process, the resulting staircase structure includes a plurality of layer stacks (or plurality of SC layers). In some embodiments, the staircase structure includes a plurality of steps, where each of the steps exposes a side and a portion of a top surface of each SC layer. In some embodiments, the height of each of the steps is one level, which is equal to the thickness of a SC layer.

Further, in operation 920, a layer of each SC layer is recessed. The recess process uses similar techniques as etching the alternating layer stack. In some embodiments, a sacrificial layer of each SC layer is recessed using the recess process. In some embodiments, the recess process etches a sacrificial layer of each SC layer and has higher etching selectivity to an insulating layer of each SC layer and the hard mask layer. As a result, the staircase structure includes a plurality of steps, where a SC layer exposed by a step has a lateral recess structure. The formation of the staircase structure is described above with respect to FIGS. 2A-2B.

In operation 930, a spacer is formed at a side of each step of the staircase structure. A material layer is disposed on the staircase structure. In some embodiments, the material layer fills a recess in each of the SC layers. In some embodiments, the material layer is conformally disposed on the staircase structure. In some embodiments, the material layer is made of a similar material as the hard mask layer. In some embodiments, formation of the material layer uses similar techniques as forming the hard mask layer.

Further, in operation 930, a portion of the material layer is removed to form a spacer at a side of each of the SC layers. The removal of the material layer uses similar techniques as removing the hard mask layer. In some embodiments, the material layer is completely removed from a top of each of the SC layers. In some embodiments, the material layer is completely removed from a top of the hard mask layer. In some embodiments, the spacer fills in the recess of each of the SC layers. The spacer and the hard mask layer can be made of the same material. The formation of the spacers is described above with respect to FIGS. 3-4.

In operation 940, a portion of a layer of each of the SC layers is removed using the spacers and hard mask layer as a mask. In some embodiments, a portion of an insulating layer of each of the SC layers is removed. The removal of the portion of the layer of each of the SC layers uses similar techniques as removing the alternating layer stack. An example of operation 940 is described above with respect to FIG. 5.

In operation 950, a landing pad is formed at each layer stack of the staircase structure. A dielectric layer is disposed to cover a top surface and a portion of a side of the staircase structure, including a portion of a side of each spacer and a side of an insulating layer of each of the SC layers. The dielectric layer is substantially thinner at a side of the staircase structure than at a top surface of the staircase structure. In some embodiments, the dielectric layer is discontinuous between steps of the staircase structure. The dielectric layer can be a nitride layer. In some embodiments, the dielectric layer and the sacrificial layer are made of the same material, where forming the dielectric layer uses similar techniques as forming the sacrificial layer.

Operation 950 further includes removing a portion of the dielectric layer and the spacer to form a landing pad on each of the SC layers. The removal of the spacer and the dielectric layer uses an etch process similar to that for forming the staircase structure from the alternating layer stack and the hard mask layer. In some embodiments, the dielectric layer is completely removed from a side of each of the SC layers. In some embodiments, after removing the spacer and the portion of the dielectric layer, the dielectric layer remaining on each of the SC layer forms the landing pad. The landing pad and the sacrificial layer can be made of the same material. The formation of landing pads is described above with respect to FIGS. 6-7.

In operation 960, a wordline layer at each layer of the staircase structure is formed. For example, the hard mask layer on a top surface of the staircase structure can be removed using an etch process. The etch process can include a wet etch process using tetramethylammonium hydroxide (TMAH). In some embodiments, the etch process lifts-off a landing pad at a top of the hard mask layer. Operation 960 further includes forming word lines of the memory device (e.g., 3D memory device) by replacing each of the landing pads and the insulating layers of each of the SC layers with one or more conductive material. This replacement starts from forming a recess at each SC layer of the staircase by removing the landing pad and the insulating layer of each SC layer. The one or more conductive material is disposed in the recess of each SC layer to form a word line in the staircase structure. After forming the word lines, a dielectric layer is disposed over the staircase structure for the BEOL interconnect process.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure and thus are not intended to limit the present disclosure and the appended claims.

The breadth and scope of the present disclosure should not be limited by any of the above-described exemplary embodiments, but should be defined only in accordance with the following claims and their equivalents.

What is claimed is:

1. A staircase structure of a memory device, comprising:
   a first material layer and a second material layer, wherein the first material layer is disposed over a first portion of the second material layer; and
   a landing pad disposed over a second portion of the second material layer, wherein the landing pad comprises a first side surface and a second side surface, and wherein the first side surface is in contact with the first material layer and the second side surface is laterally displaced from a side surface of the second portion of the second material layer.

2. The staircase structure of claim 1, further comprising a dielectric layer in contact with a bottom surface of the landing pad, the second side surface of the landing pad, and the side surface of the second portion of the second material layer.

3. The staircase structure of claim 1, wherein a lateral distance between the second side surface and the side surface of the second portion of the second material layer is between 10 nm and 300 nm.

4. The staircase structure of claim 1, wherein the landing pad comprises a conductive material.

5. The staircase structure of claim 4, wherein the conductive material comprises tungsten, silicide, nickel, titanium, platinum, aluminum, titanium nitride, tantalum nitride, tungsten nitride, or a combination thereof.

6. The staircase structure of claim 1, wherein the second material layer is disposed over a first portion of another first material layer, and wherein a side surface of a second portion of the another first material layer is laterally displaced from the second side surface of the landing pad.

7. The staircase structure of claim 1, wherein the second material layer comprises a first conductive material and the landing pad comprises a second conductive material substantially the same as the first conductive material.

8. A memory device, comprising:
   a memory string disposed over a substrate; and
   a staircase structure disposed adjacent to the memory string, wherein the staircase structure comprises:
     a conductive layer comprising first and second portions;
     an insulating layer disposed over the first portion of the conductive layer, wherein the insulating layer comprises a first thickness; and
     a landing pad disposed on the second portion of the conductive layer and in contact with a side surface of the insulating layer, wherein the landing pad comprises a second thickness greater than the first thickness.

9. The memory device of claim 8, wherein the conductive layer is disposed over a first portion of another insulating layer, wherein a second portion of the another insulating layer is laterally displaced from the conductive layer.

10. The memory device of claim 8, wherein the conductive layer comprises a first conductive material and the landing pad comprises a second conductive material substantially the same as the first conductive material.

11. The memory device of claim 10, further comprising a dielectric layer in contact with a bottom surface of the landing pad, a side surface of the landing pad, and a side surface of the second portion of the conductive layer.

12. A memory device, comprising:
    a first material layer and a second material layer, wherein the first material layer is disposed over a first portion of the second material layer; and
    a landing pad disposed over a second portion of the second material layer, wherein the landing pad comprises a first side surface and a second side surface, and wherein the first side surface is in contact with the first material layer and the second side surface is laterally displaced from a side surface of the second portion of the second material layer.

13. The memory device of claim 12, wherein the first side surface comprises a curved side surface.

14. The memory device of claim 13, further comprising another second material layer disposed on the first material layer, wherein a first lateral distance between the first side surface and a side surface of the another second material layer is smaller than a second lateral distance between the second side surface and the side surface of the another second material layer.

15. The memory device of claim 13, wherein the second side surface is laterally displaced from the first side surface, and wherein a first lateral distance between the first side surface and the first portion of the second material layer is smaller than a second lateral distance between the second side surface and the first portion of the second material layer.

16. The memory device of claim 12, wherein the second material layer comprises tungsten, and titanium nitride.

17. The memory device of claim 12, wherein the second material layer comprises a first conductive material and the landing pad comprises a second conductive material substantially the same as the first conductive material.

18. The memory device of claim 12, wherein a lateral distance between the second side surface and the side surface of the second portion of the second material layer is between 10 nm and 300 nm.

19. The memory device of claim 12, further comprising:
   a dielectric layer disposed over the first material layer and the landing pad, wherein the first material layer comprises a first dielectric material and the dielectric layer comprises a second dielectric material, wherein the first dielectric material is substantially the same as the second dielectric material, and wherein the first dielectric material comprises silicon oxide.

20. The memory device of claim 12, wherein the second material layer is disposed over a first portion of another first material layer, and wherein a side surface of a second portion of the another first material layer is laterally displaced from the second side surface of the landing pad.

\* \* \* \* \*